(12) United States Patent
Tanaka (10) Patent No.: US 6,317,365 B1
(45) Date of Patent: Nov. 13, 2001

(54) SEMICONDUCTOR MEMORY CELL (75) Inventor: Yasuomi Tanaka, Hamamatsu (JP)

(73) Assignee: Yamaha Corporation, Shizuoka-ken (JP)

( * ) Notice: Subject to any disclaimer, the term of this patent is extended or adjusted under 35 U.S.C. 154(b) by 0 days.

(21) Appl. No.: 09/332,875

(22) Filed: Jun. 15, 1999

(30) Foreign Application Priority Data

Jun. 24, 1998 (JP) .................................................. 10-177763
Jul. 17, 1998 (JP) .................................................. 10-204048

(51) Int. Cl.$^7$ ................................................. G11C 11/34
(52) U.S. Cl. ..................... 365/187; 365/189.04; 365/214
(58) Field of Search .............................. 365/187, 189.04, 365/214

(56) References Cited

U.S. PATENT DOCUMENTS

| | | | |
|---|---|---|---|
| 4,935,896 | * 6/1990 | Matsumura et al. | 365/187 |
| 5,646,903 | * 7/1997 | Johnson | 365/230.05 |
| 5,841,690 | * 11/1998 | Shibutani et al. | 365/149 |
| 5,936,881 | * 8/1999 | Kawashima et al. | 365/149 |
| 6,016,268 | * 1/2000 | Worley | 365/149 |

FOREIGN PATENT DOCUMENTS

| | | |
|---|---|---|
| 49-64350 | 6/1974 | (JP) . |
| 60-115096 | 6/1985 | (JP) . |
| 62-245595 | 10/1987 | (JP) . |

* cited by examiner

*Primary Examiner*—Amir Zarabian
*Assistant Examiner*—Tuan T. Nguyen
(74) *Attorney, Agent, or Firm*—Reed Smith Hazel & Thomas LLP (57) ABSTRACT A semiconductor memory cell is configured using a sense amplifier and a memory cell containing MOS transistors. In a write cycle, the sense amplifier inputs write data to accumulate charges in the memory cell. In a read cycle, the sense amplifier outputs read data in response to the charges accumulated in the memory cell. A cell array is configured using sense amplifiers and memory cells, which are arranged in a matrix form in such a way that each sense amplifier is connected with the memory cells which are arranged in a same column. In addition, a pair of a write word line and a read word line are shared by the memory cells which are arranged in a same row, while a pair of a write bit line and a read bit line are shared by the memory cells which are arranged in a same column. Further, the sense amplifier is connected with the pair of the write bit line and read bit line. The write word line is arranged between the read word line and a ground line having a ground level. Thus, it is possible to stabilize the write word line in level because its adjoining write word line hardly interferes with the write word line at a random-access mode. In addition, by reducing the duration in writing of data into the memory cell, it is possible to prevent charges accumulated in the memory cell from easily leaking onto the write bit line.

4 Claims, 9 Drawing Sheets

SEMICONDUCTOR MEMORY CELL

BACKGROUND OF THE INVENTION

1. Field of the Invention

This invention relates to semiconductor memory cells configured by semiconductor devices such as MOS transistors.

This application is based on Patent Application No. Hei 10-177763 and Patent Application No. Hei 10-204048 both filed in Japan, the contents of which are incorporated herein by reference.

2. Description of the Related Art

Conventionally, the semiconductor memory cells are configured using MOS transistors (where "MOS" is an abbreviation for "Metal-Oxide Semiconductor"). For example, FIG. 10 shows a memory cell of a three-transistor type, which uses three n-channel MOS transistors.

Figure 10:
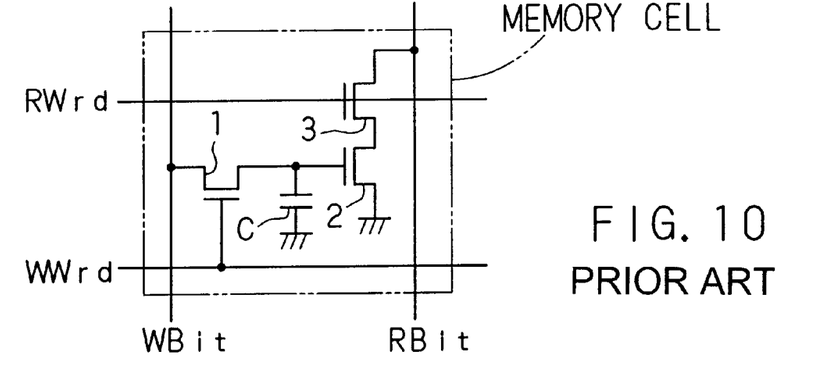
FIG. 10 is a circuit diagram showing an example of a memory cell.

Concretely speaking, the memory cell of FIG. 10 is mainly configured by a transistor 1 used for write control, a transistor 2 having capacitance (or capacity) C for accumulating (electric) charges at its gate, and a transistor 3 used for read control.

As for the transistor 1, a gate is connected to a write word line WWrd, a drain is connected to a write bit line WBit, and a source is connected to the gate of the transistor 2. Herein, the write bit line WBit is set at a level corresponding to write data. As for the transistor 2, a source is grounded while a drain is connected to a source of the transistor 3. As for the transistor 3, a gate is connected to a read word line RWrd, while a drain is connected to a read bit line RBit used for read operations.

Next, a description will be given with respect to operations of the memory cell of FIG. 10. At a write mode, a high (logical) level (or H level) is applied to the write word line WWrd, so that the transistor 1 is turned on. Thus, electric charges corresponding to the level of the write bit line WBit are accumulated at the gate of the transistor 2. That is, the charges are accumulated at the gate of the transistor 2 when the write bit line WBit is at the H level, while the charges are not accumulated at the gate of the transistor 2 when the write bit line WBit is at a low (logical) level (or L level).

At a read mode, the read bit line RBit is pre-charged, in other words, the H level is applied to RBit, thereafter, the H level is applied to the read word line RWrd.

In this case, if the memory cell accumulates the charges, the transistors 2 and 3 are turned on. As a result, the read bit line RBit is changed in level from the H level due to the pre-charging to the L level corresponding to the ground level.

If the memory cell does not accumulate the charges, the transistor 2 remains "off", so the read bit line RBit remains at the H level due to the pre-charging.

In short, in response to the charges accumulated in the memory cell, the level of the read bit line RBit is changed to the L level, or it is maintained at the H level. Thus, it is possible to actualize storage of data in the memory cell. In the present description, accumulation of charges at the gate will be referred to as writing of data "0" into the memory cell. For this reason, an event that the level of the read bit line RBit is changed to the L level will be referred to as an event that the data "0" is read from the memory cell.

By the way, due to "junction leak" and "sub-threshold leak", the charges (or data) accumulated in the memory cell disappear over a lapse of time. Particularly, sub-threshold current of the transistor 1 increases exponentially against gate voltage. So, it is easily influenced by (states of) the write word line WWrd supplying the gate voltage.

In general, a number of memory cells are arranged in a matrix form to construct a cell array. Herein, the memory cells disposed in a same column in the cell array share a bit line, while the memory cells disposed in a same row share a word line.

When variations occur on the level of the write word line WWrd due to interference which is caused by access to other memory cells, variations occur remarkably on amounts of leaked charges with respect to all of the memory cells connected to the write word line WWrd. On the other hand, amounts of leaked charges remain constant with respect to the memory cells connected to the write word line which is not varied in level. For this reason, the memory cells differ from each other in amounts of leaked charges. This means that the cell array as a whole is very unstable in operations.

Figure 11:
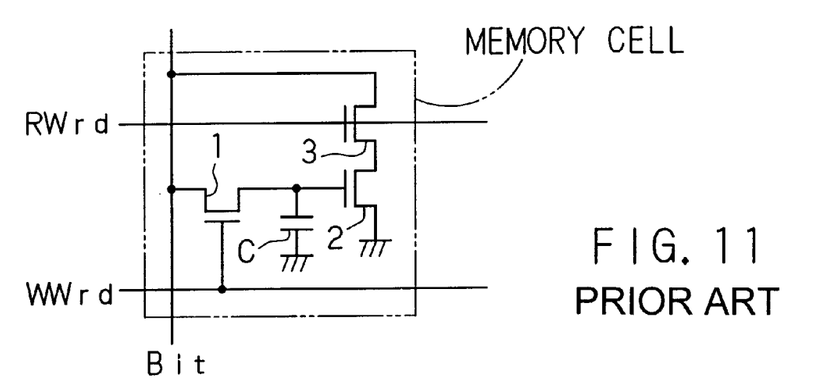
FIG. 11 is a circuit diagram showing another example of the memory cell.

FIG. 11 shows another example of the memory cell, which is a modification of the aforementioned memory cell of FIG. 10. That is, the memory cell of FIG. 10 is modified in such a way that the write bit line WBit and the read bit line RBit are shared by a single bit line Bit. As compared with the memory cell of FIG. 10, the memory cell of FIG. 11 is advantageous in that when being integrated, a chip area can be reduced.

By the way, the charges (or data) accumulated at the gate of the transistor leak over a lapse of time. In order to maintain the charges, it is necessary to perform injection of charges every prescribed time. Such operation regarding the injection of charges is referred to as "refresh" in general.

Next, a description will be given with respect to the refresh, which is mainly performed in three steps as follows:

(1) The read bit line RBit or the bit line Bit is pre-charged.

(2) The H level is applied to the read word line RWrd so as to make a decision as to level transition in the read bit line RBit or the bit line Bit.

(3) The H level is applied to the write word line WWrd, and a signal having an inverse level of the bit line after the level transition is applied to the write bit line WBit or the bit line Bit.

Figure 12:
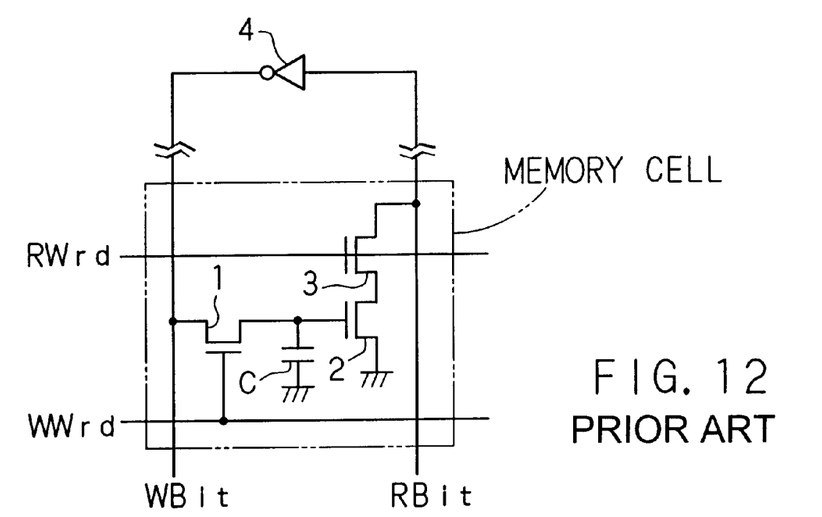
FIG. 12 is a circuit diagram showing an example of a refresh circuit.

In the case of the memory cell of FIG. 10, for example, the refresh is made by using an inverter 4, which is introduced between the bit lines WBit and RBit as shown in FIG. 12. That is, the inverter 4 inverts the level of the read bit line RBit, so that the inverted level is applied to the write bit line WBit. Thus, it is possible to rewrite the charges to the same memory cell.

As described above, in order to refresh the data of the memory cell, it is necessary to provide at least three steps, i.e., pre-charge step of the read bit line, data read step and data rewrite step. Herein, the pre-charge step of the read bit line cannot be performed simultaneously with the data read step. For this reason, it is necessary to provide a specific duration for the pre-charging. This causes a trouble in efficient use of the memory cell. Such a trouble becomes remarkable in the case of the memory cell which is designed to share the read and write bit lines by a single bit line as shown in FIG. 11.

SUMMARY OF THE INVENTION

It is an object of the invention to provide a semiconductor memory cell which is stabilized in amounts of accumulated charges by suppressing level variations of write word lines, due to random access, to the minimum.

It is another object of the invention to provide a read/write circuit for the semiconductor memory cell which is capable of performing random access, wherein the data read step and data rewrite (or refresh) step can be performed efficiently without using the specific duration for the pre-charging.

A semiconductor memory cell of this invention is configured using a sense amplifier and a memory cell, which is configured using MOS transistors, for example. In a write cycle, the sense amplifier inputs write data to accumulate charges in the memory cell. In a read cycle, the sense amplifier outputs read data in response to the charges accumulated in the memory cell. A cell array is configured using sense amplifiers and memory cells, which are arranged in a matrix form in such a way that each sense amplifier is connected with the memory cells which are arranged in a same column. In addition, a pair of a write word line and a read word line are shared by the memory cells which are arranged in a same row, while a pair of a write bit line and a read bit line are shared by the memory cells which are arranged in a same column. Or, a single bit line is shared by the memory cells which are arranged in the same column. Further, the sense amplifier is connected with the pair of the write bit line and read bit line or the single bit line. The write word line is arranged between the read word line and a ground line having a ground level. Thus, it is possible to stabilize the write word line in level because its adjoining write word line (or adjoining read word line) hardly interferes with the write word line even if a random access is made. Now, the write word line is activated to perform write operations simultaneously on the memory cells which are arranged in the same row, so that the memory cells accumulate charges therein in response to write data input to the sense amplifiers. The read word line is activated to perform read operations simultaneously on the memory cells which are arranged in the same row, so that the sense amplifiers output read data in response to the charges accumulated in the memory cells. In response to an access, all of the memory cells which are arranged in the same row automatically perform a series of operations such as the read operation, latch and write operation (or rewrite operation). This avoids troubles due to leak of charges from the memory cells caused by level variations of the write word line.

Incidentally, by reducing the duration in writing of data into the memory cell, it is possible to prevent charges accumulated in the memory cell from easily leaking onto the (write) bit line.

BRIEF DESCRIPTION OF THE DRAWINGS

These and other objects, aspects and embodiments of the present invention will be described in more detail with reference to the following drawing figures, of which.

DESCRIPTION OF THE PREFERRED EMBODIMENTS

This invention will be described in further detail by way of examples with reference to the accompanying drawings.

[A] Embodiment 1

Figure 1:
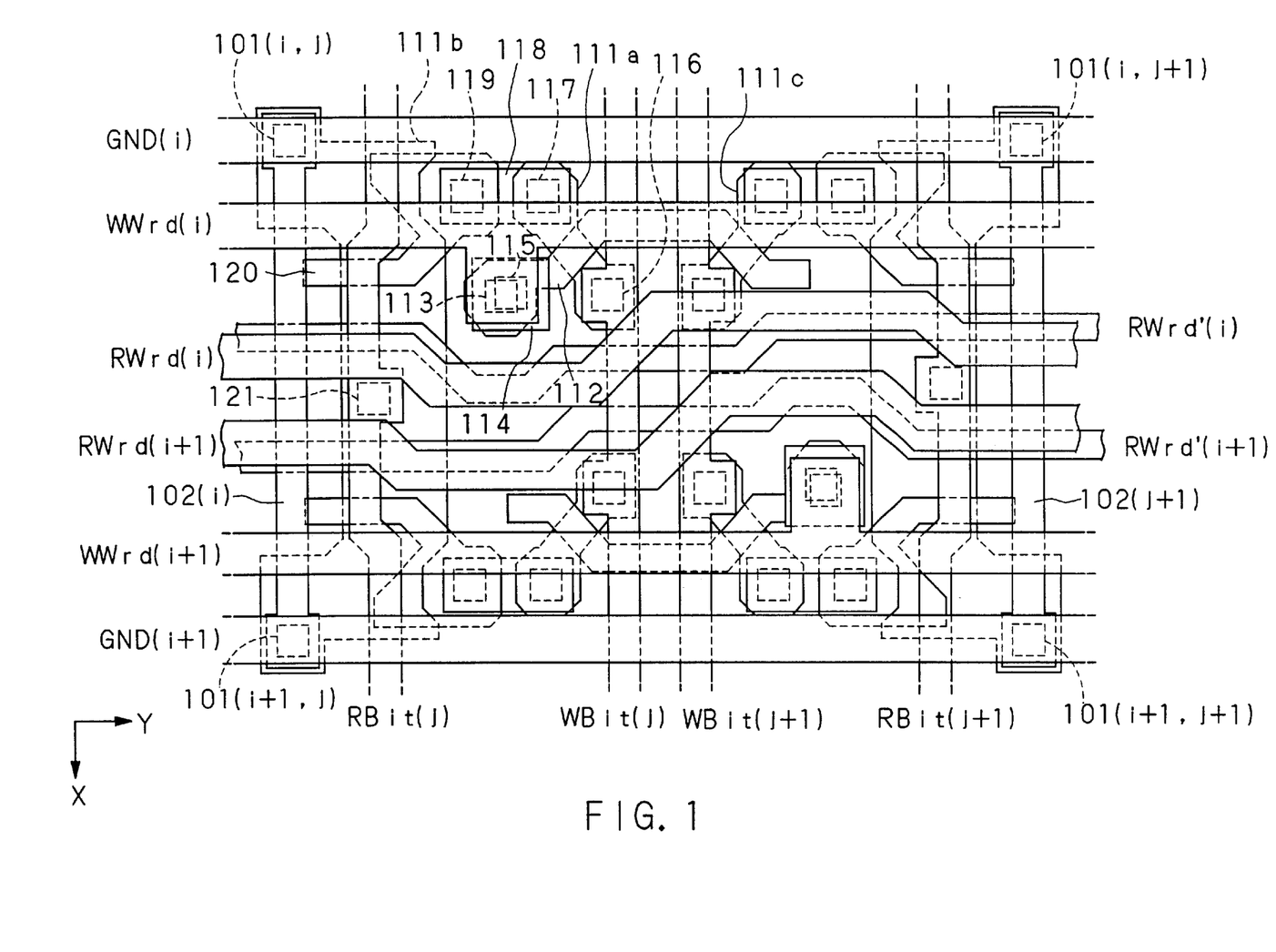
FIG. 1 is a schematic diagram in plan view showing a configuration of a cell array, which is configured by sense amplifiers and memory cells in accordance with embodiment 1 of the invention.
Figure 2:
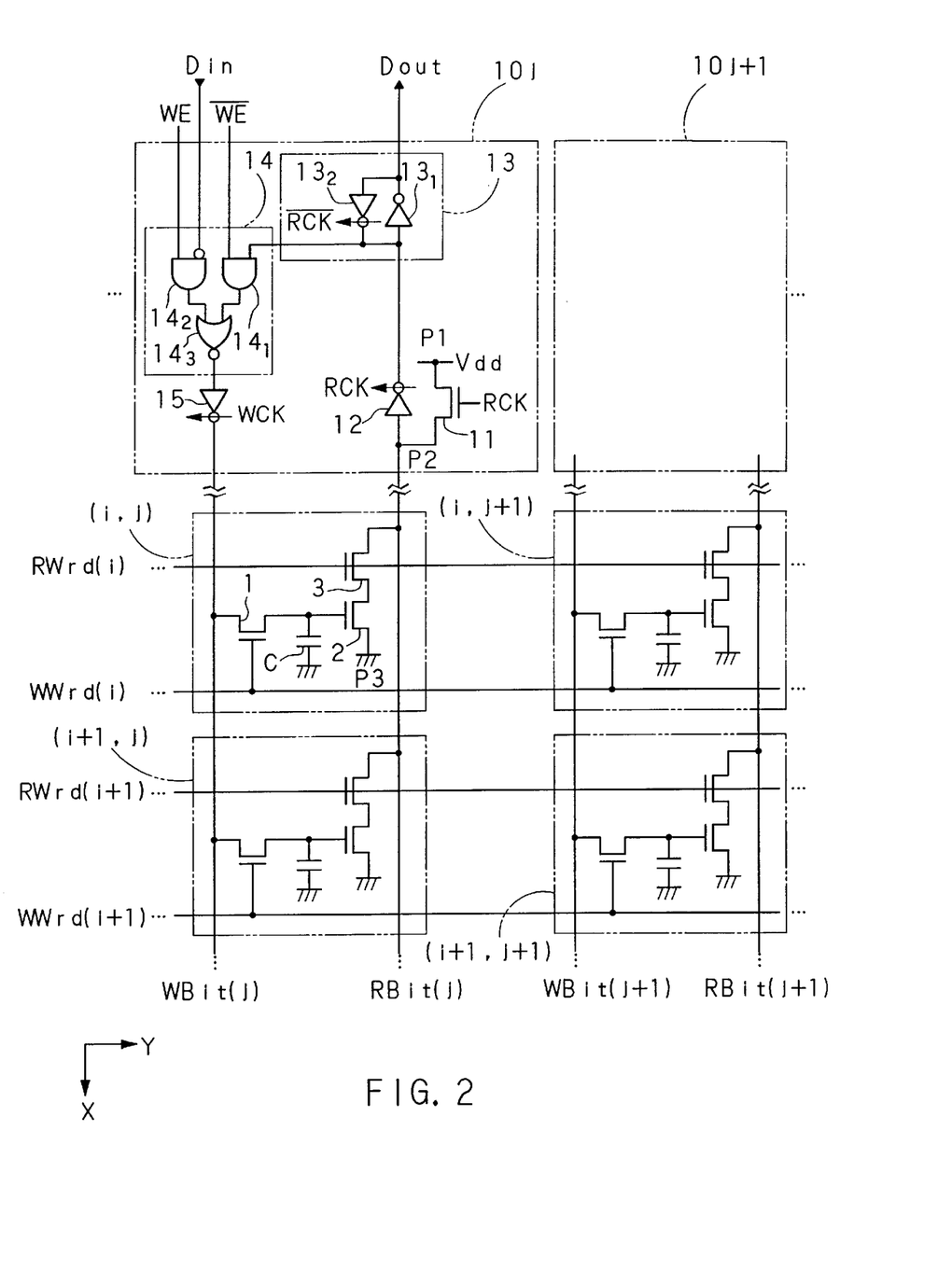
FIG. 2 is a circuit diagram showing circuit configurations of selected parts of the cell array shown in FIG. 1.
Figures 3A, 3B:
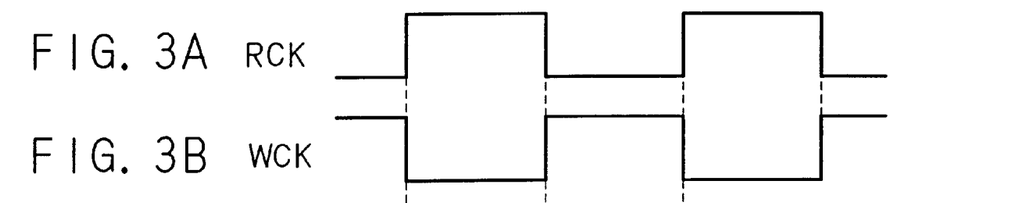
FIG. 3A shows read clock pulses RCK.
FIG. 3B shows write clock pulses WCK.
Figure 3C:
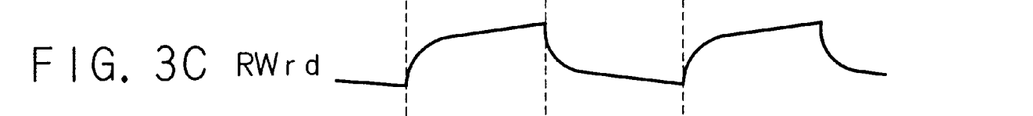
FIG. 3C shows variations in level of a read word line.
Figure 3D:
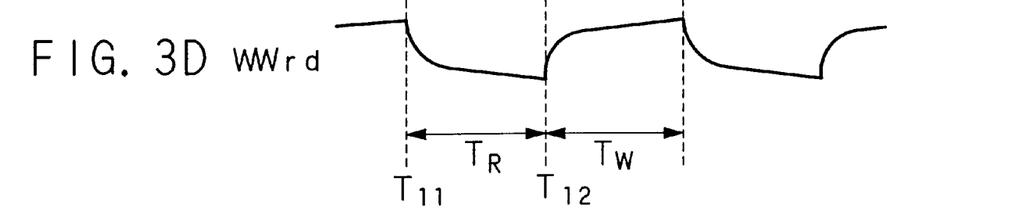
FIG. 3D shows variations in level of a write word line.

FIG. 1 is a schematic diagram in plan view showing a configuration of a cell array, which is configured using sense amplifiers and memory cells in accordance with embodiment 1 of the invention. FIG. 2 is a circuit diagram showing circuits of selected parts of the cell array shown in FIG. 1. The cell array of FIG. 1 is formed by arranging a number of memory cells in a matrix form, wherein each of the memory cells is configured as similar to the aforementioned memory cell of FIG. 12 which uses three transistors 1, 2, 3 and a capacitor C. Herein, the memory cells disposed in a same column share a same read bit line RBit and a same write bit line WBit respectively. In addition, the memory cells disposed in a same row share a same read word line RWrd and a same write word line WWrd respectively.

In such matrix arrangement of the memory cells, a memory cell located at a position defined by a row "i" and a column "j" is designated by symbols of "(i,j)". In addition, symbols designating each of the bit line and word line are accompanied with the aforementioned symbols of "i" and "j", each of which is contained in parentheses. In other words, each of the lines is designated using a number of the row or a number of the column, which is contained in parentheses. For example, a read word line RWrd(i) and a write word line WWrd(i) are shared by memory cells which are disposed in a row "i".

In addition, a sense amplifier 10 is provided with respect to each column of the cell array. Thus, data are read from or written into a memory cell, which is made active within the memory cells disposed in a same column of the cell array. Next, a description will be given with respect to a configuration of the sense amplifier by way of an example of a sense amplifier "$10_j$," which is provided for memory cells disposed in a column "j" of the cell array.

As for a n-channel MOS transistor 11 in the sense amplifier $10_j$, a source is connected to a read bit line RBit(j) while a drain is connected to a line of source voltage Vdd. In addition, read clock pulses RCK are supplied to a gate of the n-channel MOS transistor 11. So, the MOS transistor 11 is turned on or off in response to the read clock pulses RCK. Herein, "on" resistance (or on-resistance) between the source and drain of the MOS transistor 11 is made double or more as compared with on-resistance of the transistor 2 or 3 of the memory cell.

An inverter 12 makes a decision as to level of the read bit line RBit(j). Thus, it outputs an inverted level in response to the read clock pulses RCK. Herein, the inverter 12 uses a threshold value in inversion, which is set at a midpoint (i.e., Vdd/2) between the H level and L level. For convenience' sake, "P1" designates a supply point of the source voltage Vdd, while "P2" designates an input point to input the source voltage to the inverter 12.

An inverter $13_1$, inverts an output of the inverter 12 so as to output read data Dout, which correspond to the inverted output of the inverter 12.

An inverter $13_2$ inverts an output (i.e., data Dout) of the inverter $13_1$ in response to "inverted" read clock pulses of RCK.

The inverters $13_1$ and $13_2$ are connected together in such a way that one inputs an output of the other. That is, a latch circuit 13 is configured by those inverters $13_1$ and $13_2$. So, the latch circuit 13 latches the output of the inverter 12 in response to the inverted read clock pulses of RCK.

A selector 14 is configured by two AND gates $14_1$, $14_2$ and one NOR gate $14_3$. The AND gate $14_1$ calculates a logical product between an inverse of a write enable signal WE and the output of the inverter 12 which is latched by the latch circuit 13. The AND gate $14_2$ calculates an inverse of new write data Din and the write enable signal WE. The NOR gate $14_3$ produces an inverse logical sum between the logical products of the AND gates $14_1$ and $14_2$.

Therefore, the selector 14 works as follows:

When the write enable signal WE is active so that a write operation is designated, the selector 14 outputs the new write data Din. When the write enable signal WE is non-active so that the write operation is not designated, the selector 14 outputs the read data Dout.

An inverter 15 inverts an output of the selector 14 in response to write clock pulses WCK. So, it supplies an inverse of the output of the selector 14 onto the write bit line WBit(j).

Next, a description will be given with respect to wiring patterns of the memory cells in the cell array. FIG. 1 is a plan view showing the wiring pattern effected between four memory cells, which adjoin each other and which are designated by reference symbols in parentheses of (i,j), (i+1,j), (i,j+1) and (i+1,j+1) respectively.

As shown in FIG. 1, there are provided a first pair of the two memory cells (i,j) and (i,j+1) which adjoin each other and which are disposed in a same row, and a second pair of the two memory cells (i+1,j) and (i+1,j+1) which adjoin each other and which are disposed in a next row. Herein, those pairs of the memory cells are arranged alternately in such a way that the first pair of the memory cells face with the second pair of the memory cells which are rotated by 180° in positions.

A write word line WWrd(i) is commonly shared by memory cells which are disposed in a row i. Similarly, both of a ground line GND(i) and a read word line RWrd(i) are commonly shared by the memory cells in the row i. Herein, the write word line WWrd(i) is arranged between the ground line GND(i) and the read word line RWrd(i). In addition, a write word line WWrd(i+1), a ground line GND(i+1) and a read word line RWrd(i+1) are all commonly shared by memory cells which are disposed in a row (i+1). Herein, the write word line WWrd(i+1) is arranged between the ground line GND(i+1) and the read word line RWrd(i+1).

The ground lines GND(i) and GND(i+1) are connected with each other at first ends thereof by means of a contact hole 101(i,j), a short-circuit pattern 102(j) and a contact hole 101(i+1,j). In addition, they are also connected with each other at second ends thereof by means of a contact hole 101(i,j+1), a short-circuit pattern 102(j+1) and a contact hole 101(i+1,j+1).

The read word line RWrd(i) overlaps with a read word line RWrd'(i) by different layers. In other words, those lines are formed in an overlap layer structure. Herein, conduction is adequately secured between those lines at terminal portions or intermediate portions of the cell array. Similarly, the read word line RWrd(i+1) overlaps with a read word line RWrd'(i+1) by different layers.

Next, a description will be given with respect to relationships between the transistors and their wiring patterns by way of an example of the memory cell (i,j).

In the memory cell (i,j) shown at an upper left portion of FIG. 1, a reference symbol "111a" designates an active layer of the transistor 1 which corresponds to the source, drain and channel regions, while "111b" designates an active layer of the transistors 2 and 3. Herein, the active layer 111b also serves as another active layer for the transistors 2 and 3 of the memory cell (i+1,j) which adjoins the memory cell (i,j) in a same column j.

A gate electrode 112 is arranged in the active layer 111a. The gate electrode 112 is connected to the write word line WWrd(i) by means of a contact hole 113, a conductive layer 114 and a contact hole 115. Incidentally, the gate electrode 112 of the active layer 111a of the memory cell (i,j) also serves as a gate electrode for an active layer 101c of the memory cell (i,j+1) which adjoins the memory cell (i,j) in the same row i.

The drain region of the active layer 111a is connected to a write bit line WBit(j) by means of a contact hole 116. In addition, the source region of the active layer 111a is connected to a contact hole 117, a conductive layer 118, a contact hole 119 and a gate electrode 120 respectively.

In the active layer 111b of the memory cell (i,j), there are arranged the gate electrode 120 for the transistor 2 and the read word line RWrd'(i) which serves as a gate electrode for the transistor 3.

A source region of the transistor 2 arranged in the active layer 111b is connected to the ground line GND(i) by means of the contact hole 101(i,j). In the active layer 111b, a drain region of the transistor 2 and a source region of the transistor 3 are arranged between the gate electrode 120 and the read word line RWrd'(i). In addition, a drain region of the transistor 3 arranged in the active layer 111b is connected to a read bit line RBit(j) by means of a contact hole 121.

The memory cell (i,j+1) is roughly identical to the memory cell (i,j) in configurations except the contact hole 113, the conductive layer 114 and the contact hole 115, which are excluded from the memory cell (i,j+1). Therefore, the aforementioned first pair of the two memory cells are formed using the memory cells (i,j) and (i,j+1), which adjoin each other in the same row i. In addition, the aforementioned second pair of the two memory cells are formed using the memory cells (i+1,j) and (i+1,j+1), configurations of which match with the memory cells (i,j) and (i,j+1) which are rotated by 180° in positions. Thus, it is possible to provide the four memory cells in total.

Next, a description will be given with respect to operations of the memory cells with reference to FIGS. 3A, 3B, 3C and 3D, wherein a read cycle $T_R$ and a write cycle $T_W$ alternately emerge over a lapse of time.

Suppose that the memory cells disposed in the row i are selected, wherein operations of the memory cell (i,j) located in the column j will be described.

A leading edge of a read clock pulse RCK appears at a start time $T_{11}$ of the read cycle $T_R$, so the H level is applied to the read word line RWrd(i). At this time, the read clock pulse RCK is at the H level, so the transistor 11 of the sense amplifier $10_j$ (see FIG. 2) is turned on. Thus, the read bit line RBit(j) is pulled up to the source voltage Vdd.

If charges are accumulated in the memory cell (i,j), the read bit line RBit(j) will be reduced in level to a ground level because the transistors 2 and 3 are turned on. Therefore, the input point P2 of the inverter 12 descends in level to a certain potential level, which is determined by a ratio between first and second resistances between the source voltage Vdd and ground level. Herein, the first resistance including resistance of the transistor 11 appears in a path between the points P1 and P2, while the second resistance including resistances of the transistors 2 and 3 appears in a path which starts from the point P2 and reaches the ground point P3 of the memory cell (i,j) via the read bit line RBit(j).

The on-resistance between the source and drain of the transistor 11 is two times or more higher than the on-resistance of the transistor 2 or transistor 3 in the memory cell. Therefore, the potential level at the point P2 becomes lower than Vdd/2. So, it becomes lower than the threshold value for inversion of the inverter 12. In this case, the inverter 12 outputs a H-level signal at the leading-edge time $T_{11}$ of the read clock pulse RCK.

In contrast, if the charges are not accumulated in the memory cell (i,j), the read bit line RBit(j) is not reduced to the ground level, in other words, it remains at the pull-up level, i.e., H level. In this case, the inverter 12 outputs a L-level signal in the read cycle $T_R$ which starts from the leading-edge time $T_{11}$.

As described above, an output of the inverter 12 responds to the charges accumulated in the memory cell. In order to indicate a charged state, in which charges are accumulated in the memory cell, in connection with the L level, the output of the inverter 12 is inverted by the inverter $13_1$, which outputs read data Dout.

Next, a leading edge of a write clock pulse WCK appears at a start time $T_{12}$ of the write cycle $T_W$, so that the H level is applied to the write word line WWrd(i). At this time, the read clock pulse RCK is at the L level, so that the transistor 11 is turned off. Thus, the read bit line RBit(j) is released from the source voltage Vdd.

The write bit line WBit(j) is at an output level of the inverter 15 which inverts an output of the selector 14.

If the write enable signal WE is made active to designate a write FL operation, the selector 14 outputs new write data Din. So, the level of the write bit line RBit(j) coincides with an inverse of the write data Din.

Therefore, the write data Din correspond to the L level, so that charges are accumulated in the memory cell (i,j). If the write data Din correspond to the H level, charges are not accumulated in the memory cell (i,j). In short, the charges are accumulated in the memory cell (i,j) in response to the level of the write data Din.

If the write enable signal WE does not designate the write operation, the selector 14 outputs read data Dout. So, the level of the write bit line WBit(j) matches with an inverse of the read data Dout.

Therefore, if the read data Dout correspond to the L level, charges are accumulated in the memory cell (i,j). If the read data Dout correspond to the H level, charges are not accumulated in the memory cell (i,j). So, charges similar to previous charges which are previously accumulated before the read operation are accumulated again in the memory cell (i,j). This completes a refresh operation of the memory cell (i,j).

Other memory cells such as the memory cell (i,j+1), which are disposed in the same row i other than the memory cell (i,j) located at the column j share the read word line RWrd(i) and the write word line WWrd(i) as well. Therefore, those memory cells perform operations similar to the foregoing operations of the memory cell (i,j) at the times $T_{11}$, and $T_{12}$. Namely, all of the memory cells disposed in the same row perform a series of operations as follows:

Read operation→Latch→New write operation (or Rewrite operation)

Next, a description will be given with respect to level variations of the write word line WWrd by way of an example of the memory cell (i,j). When an access is made to a certain memory cell (e.g., memory cell (i+1,j)) which adjoins the memory cell (i,j) in a different row, level variations occur on the write word line WWrd(i+1) or the read word line RWrd(i+1). The write word line WWrd(i) is arranged between the ground line GND(i) and the read word line RWrd(i). So, the write word line WWrd(i+1) or the read word line RWrd(i+1) hardly interferes with the write word line WWrd(i). For this reason, the write word line WWrd(i) remains stable in level even when an access is made to the adjoining memory cell which adjoins the memory cell (i,j) in its different row.

On the other hand, if an access is made to the memory cell (i,j) or its adjoining memory cell in the different row, level variations occur on the read word line RWrd(i), which interferes with its adjoining write word line WWrd(i). The memory cells which are disposed in the same row of the memory cell which is accessed perform a series of operations, in connection with the access, as follows:

Read operation→Latch→New write operation (or Rewrite operation)

So, those memory cells do not have troubles due to leak of charges, which is caused to occur due to the level variations of the write word line WWrd(i).

As described above, the memory cell of the embodiment 1 is basically designed such that level variations hardly occur on the write word line WWrd even if the random access is made. So, it is possible to stabilize amounts of charges accumulated in the memory cells. Even in an exceptional case where due to the level variations, the read word line RWrd interferes with the write word line WWrd, the memory cells do not have troubles because of rewrite operations which are performed just after occurrence of the level variations of the read word line RWrd.

Incidentally, the sense amplifier and memory cell of the embodiment 1 are designed to have technical features as follows:

(i) The on-resistance between the source and drain of the transistor 11 is increased two times or more higher than the on-resistance of the transistor 2 or 3 of the memory cell.

(ii) The inverter 12 has the threshold value of Vdd/2 in inversion, so that the output of the inverter 12 is extracted in response to an amount of charges accumulated in the memory cell.

However, this invention is not necessarily limited ones having those technical features. For example, it is possible to modify the present embodiment as follows:

(i) The threshold value in inversion is set to the inverter 12 in response to the on-resistance between the source and drain of the transistor 11.

(ii) It is possible to provide a resistance component, which is made of poly-silicone and which is inserted between the supply point P1 of the source voltage Vdd and the input point P2 of the inverter 12.

In addition, the present embodiment is designed to employ a voltage supply structure in which the read bit line RBit is connected to the line of the source voltage Vdd by means of the transistor 11. This invention is not limited to such a structure. So, it is possible to modify it as follows:

The read bit line RBit is connected to a potential line having a constant voltage. Herein, the constant voltage is subjected to voltage division to produce a fraction of the constant voltage in response to a certain resistance ratio. Using such a fraction of the constant voltage, it is possible to cause level transition on the read bit line RBit.

[B] Embodiment 2

Figure 4:
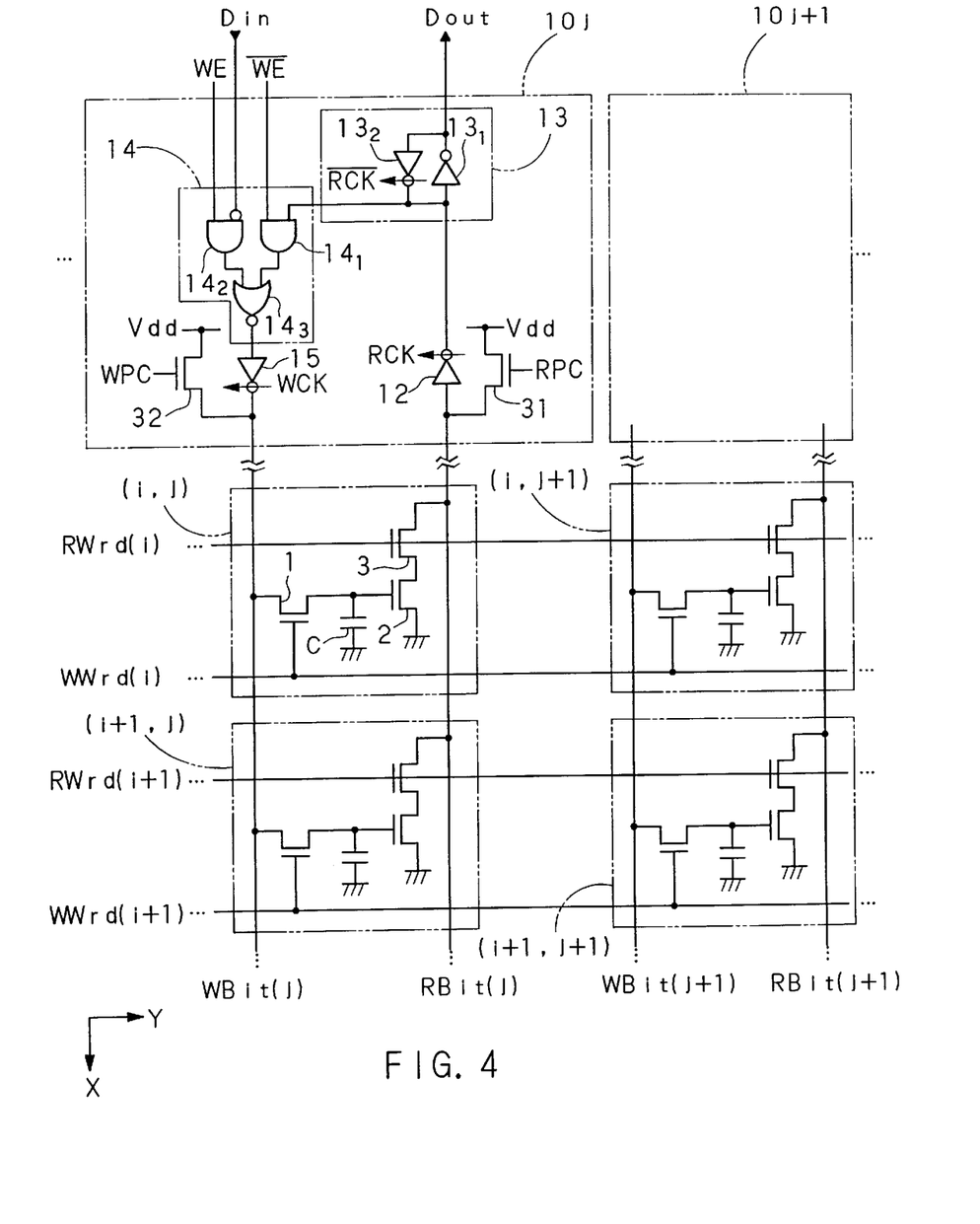
FIG. 4 is a circuit diagram showing circuits of selected parts of a cell array, which contains sense amplifiers and memory cells in accordance with embodiment 2 of the invention.
Figure 5A:
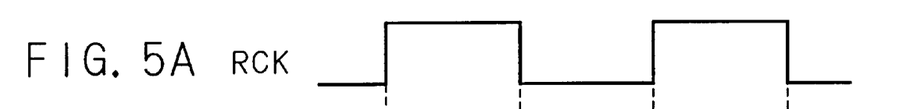
FIG. 5A shows read clock pulses RCK.
Figure 5B:
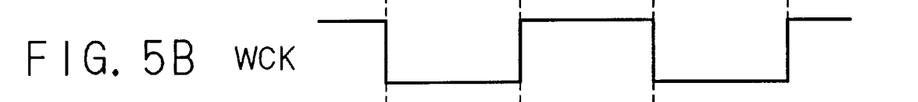
FIG. 5B shows write clock pulses WCK.
Figure 5C:
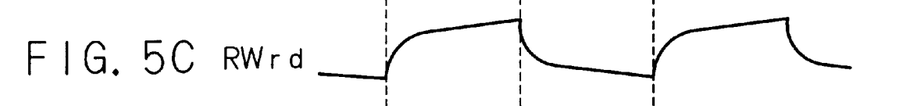
FIG. 5C shows variations in level of a read word line.
Figure 5D:
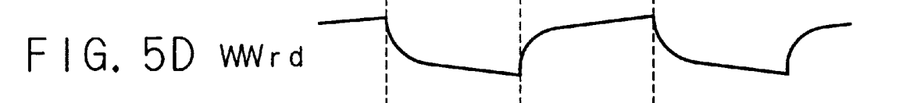
FIG. 5D shows variations in level of a write word line.
Figure 5E:
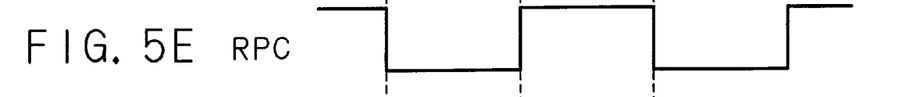
FIG. 5E shows clock pulses RPC.

Next, a description will be given with respect to a sense amplifier and a memory cell in accordance with embodiment 2 of the invention. FIG. 4 is a circuit diagram showing circuit configurations of the sense amplifier and memory cells in accordance with the embodiment 2 of the invention, wherein parts equivalent to those in FIG. 2 will be designated by the same reference symbols. The memory cells of the embodiment 2 shown in FIG. 4 are identical to the foregoing memory cells of the embodiment 1 shown in FIG. 2. So, the embodiment 2 uses basically the same wiring patterns of the embodiment 1. However, the sense amplifier shown in FIG. 4 partially differs from the sense amplifier shown in FIG. 2 as follows:

(i) The transistor 11 shown in FIG. 2 is replaced by a transistor 31 (see FIG. 4), which turns on or off in response to clock pulses RPC (see FIG. 5E).

Figure 5F:
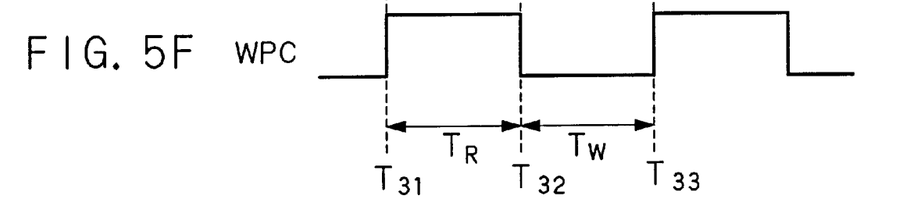
FIG. 5F shows clock pulses WPC.

(ii) A transistor 32 which turns on or off in response to clock pulses WPC (see FIG. 5F) is connected to the write bit line WBit.

Next, a description will be given with respect to operations of the sense amplifier and memory cell of the embodiment 2 with reference to FIGS. 5A to 5F. For convenience' sake, the description will be made mainly on the memory cell (i,j), which is located in the column j, within the memory cells which are selected and disposed in the row i.

Like the foregoing embodiment 1, there are provided a read cycle $T_R$ and a write cycle $T_W$, which appears alternately over a lapse of time. The clock pulse RPC shown in FIG. 5E is at the H level before a start time $T_{31}$ of the read cycle $T_R$. In this time, the transistor 31 is "on", so that the read bit line RBit(j) is connected with the line of the source voltage Vdd by means of the transistor 31 and is pre-charged. Therefore, in the next cycle (i.e., read cycle $T_R$), the read bit line RBit(j) has been already pre-charged. Thus, it is possible to perform a read operation at a high speed.

After the start time $T_{31}$ of the read cycle $T_R$, the read word line RWrd(i) is increased to the H level, while the clock pulse WPC (see FIG. 5F) is at the H level. For this reason, the transistor 32 is turned on, so that the write bit line WBit(j) is connected to the line of the source voltage Vdd by means of the transistor 32 and is pre-charged.

Occurrence of a level transition of the read bit line RBit(j) depends on a state of the memory cell (i,j) whether to accumulate charges or not. That is, if the charges are accumulated in the memory cell (i,j), the read bit line RBit(j) changes in level from the H level, corresponding to pre-charged level, to the L level which corresponds to the ground level. In contrast, if the charges are not accumulated in the memory cell (i,j), the read bit line RBit(j) remains at the H level corresponding to the pre-charged level.

Therefore, at the leading-edge timing "$T_{31}$" of the read clock pulse RCK (see FIG. 5A), an output of the inverter 12, which inverts the level of the read bit line RBit(j), matches with the H level if charges are accumulated in the memory cell (i,j). In addition, it matches with the L level if the charges are not accumulated in the memory cell (i,j). Then, the output of the inverter 12, which is an inversion of the level of the read bit line RBit(j), is inverted by the inverter $13_1$ which outputs read data Dout.

After a start time $T_{32}$ of the write cycle $T_W$, the write word line WWrd(i) is increased to the H level, while the clock pulse RPC is at the H level. For this reason, the transistor 31 is "on", so that the read bit line RBit(j) is connected to the line of the source voltage Vdd by means of the transistor 31 and is pre-charged.

At the leading-edge timing "$T_{32}$" of the write clock pulse WCK, a level of the write bit line WBit(j) is set at a level corresponding to an output of the inverter 15 which inverts an output of the selector 14.

If the aforementioned write enable signal WE designates a write operation, the level of the write bit line WBit(j) matches with an inverse of write data Din. In contrast, if the write enable signal WE does not designate the write operation, the level of the write bit line WBit(j) matches with an inverse of the read data Dout, so that it is changed from the H level corresponding to the pre-charged level, or it remains at the H level corresponding to the pre-charged level. A level transition from the H level, corresponding to the pre-charged level, to the L level is caused to occur on the write bit line WBit(j), which is pulled in to the ground level by the inverter 15.

Therefore, if the write data Din or the read data Dout coincides with the L level, charges are accumulated in the memory cell (i,j). In contrast, if the write data Din or the read data Dout coincides with the H level, the charges are not accumulated in the memory cell (i,j). Thus, the charges are newly accumulated into or re-accumulated in the memory cell (i,j) in response to the level of the write data Din or level of the read data Dout.

The read word line RWrd(i) and the write word line WWrd(i) are commonly shared by the other memory cells, which are disposed in the row i other than the memory cell (i,j) located in the column j. Therefore, in a period of time which elapses between times $T_{31}$ and $T_{33}$, those memory cells operate similar to the aforementioned memory cell (i,j). That is, all of the memory cells which are disposed in the same row perform a series of operations as follows:

Read operation→Latch→New write operation (or Rewrite operation)

Like the foregoing embodiment 1, the embodiment 2 is designed such that the write word line WWrd is arranged between the ground line GND and the read word line RWrd. Therefore, level variations hardly occur on the write word line WWrd even if a random access is made. Thus, it is possible to stabilize amounts of charges accumulated in the memory cells. In addition, even if the level variations occur on the write word line WWrd, the memory cells of the embodiment 2 do not have troubles due to leak of the charges because the rewrite operations are performed just after occurrence of the level variations on the write word line WWrd.

Incidentally, both of the aforementioned embodiments 1 and 2 are designed to configure the memory cells using the n-channel MOS transistors. However, the memory cells of this invention are not limited to those embodiments. Hence, it is possible to use p-channel MOS transistors instead of the n-channel MOS transistors.

[C] Embodiment 3

Figure 6:
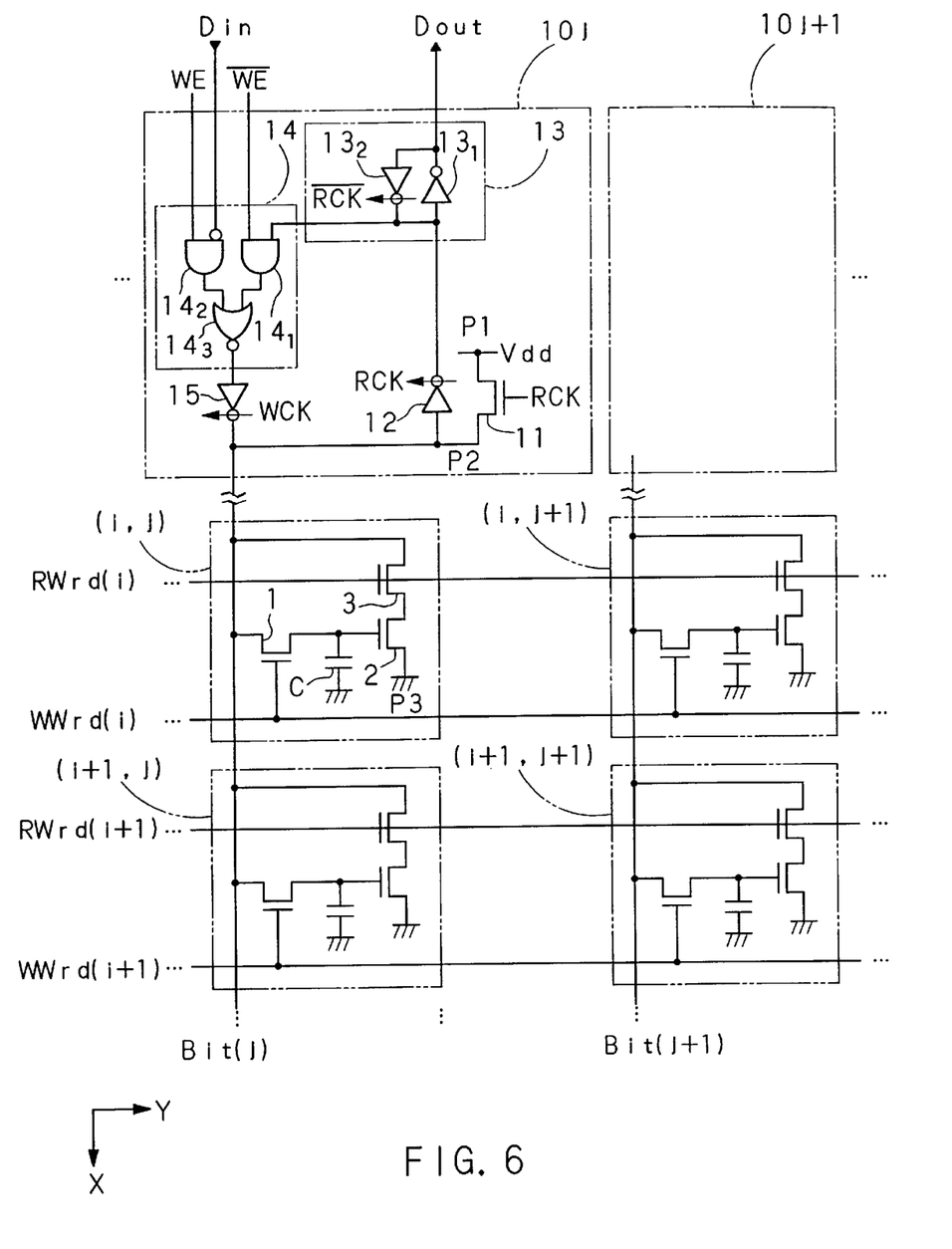
FIG. 6 is a circuit diagram showing circuit configurations of selected parts of a cell array, which is configured using sense amplifiers and memory cells in accordance with embodiment 3 of the invention.

FIG. 6 is a circuit diagram showing circuit configurations of selected parts of a cell array, which is configured using sense amplifiers and memory cells in accordance with embodiment 3 of the invention. In FIG. 6, parts equivalent to those shown in FIG. 2 will be designated by the same reference symbols, hence, the description thereof will be omitted according to needs. Different from the aforementioned cell array of FIG. 2 which is configured using the structure of the memory cell shown in FIG. 10, the cell array of FIG. 6 uses the memory cells, which are arranged in a matrix form and each of which is configured using the structure of the memory cell shown in FIG. 11. Different from the memory cell of FIG. 10 which uses two bit lines, the memory cell of FIG. 11 requires a single bit line. In FIG. 6, the memory cells which are arranged in the same column share a same single bit line (e.g., Bit(j), Bit(j+1)). In addition, the memory cells which are arranged in the same row share a pair of the read word line (e.g., RWrd(i)) and the write word line (e.g., WWrd(i)). Because of the provision of the single bit line for the memory cells which are arranged in the same column, the sense amplifier (e.g., $10_j$) shown in FIG. 6 partially differs from the foregoing sense amplifier shown in FIG. 2. That is, the inverter 12 of the sense amplifier $10_j$ shown in FIG. 6 senses a level of the bit line Bit(j) to invert it in response to the read clock pulse RCK. In addition, the inverter 15 inverts an output of the selector 14 so as to supply an inverted output thereof to the bit line Bit(j) in response to the write clock pulse WCK.

Next, a description will be given with respect to operations of the sense amplifier $10_j$ shown in FIG. 6 which partially differs from the foregoing sense amplifier shown in FIG. 2. Within the memory cells disposed in the row i, a description will be given with respect to the memory cell (i,j) which is located in the column j.

At the start time $T_{11}$ of the read cycle $T_R$, the read clock pulse RCK (see FIG. 3A) rises in level, so that the H level is applied to the read word line RWrd(i). Because of the H level of the read clock pulse RCK, the transistor 11 is turned on, so that the bit line Bit(j) is pulled up in level to the source voltage Vdd.

If the memory cell (i,j) accumulates charges therein, the transistors 2 and 3 are turned on, so that the bit line Bit(j) is pulled into the ground level. Therefore, level of the input point P2 of the inverter 12 descends down to a level determined by a resistance ratio between resistance fractions, namely, a resistance fraction (including resistance of the transistor 11) which lies between the points P1 and P2 and another resistance fraction (including resistances of the transistors 2 and 3) which lies between the point P2 and the ground point P3 via the bit line Bit(j).

The on-resistance of the transistor 11 between its source and drain is two times or more larger than the on-resistance of the transistor 2 or 3 in the memory cell (i,j). Thus, the level of the input point P2 decreases to a certain level, which is lower than Vdd/2 and which is lower than the threshold value of the inverter 12 in inversion. In this case, the inverter 12 outputs a H level signal at the leading-edge time $T_{11}$ of the read clock pulse RCK.

In contrast, if the memory cell (i,j) does not accumulate the charges, the bit line Bit(j) is not pulled into the ground level. So, the bit line Bit(j) remains at the H level corresponding to the pull-up level. In this case, the inverter 12 outputs a L level signal at the leading-edge time $T_{11}$ of the read clock pulse RCK.

As a result, an output of the inverter 12, which is an inverse of the level of the bit line Bit(j), depends on a state of the memory cell (i,j) whether to accumulate the charges or not. In order to represent the charged state of the memory cell (i,j), which accumulates the charges therein, by the L level, the output of the inverter 12 is inverted by the inverter $13_1$ which outputs read data Dout.

At the start time $T_{12}$ of the write cycle $T_W$, the write clock pulse WCK (see FIG. 3B) rises in level, so that the H level is applied to the write word line WWrd(i). Because of the L level of the read clock pulse RCK, the transistor 11 is turned off, so that the bit line Bit(j) is released from the source voltage Vdd.

Therefore, the level of the bit line Bit(j) corresponds to an output level of the inverter 15 which inverts an output of the selector 14.

If the write enable signal WE designates a write operation, the selector 14 selectively outputs new write data Din. So, the level of the bit line Bit(j) corresponds to an inversion in level of the write data Din.

If the write data Din corresponds to the L level so that the bit line Bit(j) is at the H level, the memory cell (i,j) accumulates charges therein. In contrast, if the write data Din corresponds to the H level, the memory cell (i,j) does not accumulate the charges. Thus, it is possible to accumulate the charges in the memory cell (i,j) in response to the level of the write data Din.

On the other hand, if the write enable signal WE does not designate the write operation, the selector 14 selectively outputs the read data Dout. So, the level of the bit line Bit(j) corresponds to an inverse in level of the read data Dout.

If the read data Dout corresponds to the L level so that the bit line Bit(j) is at the H level, the memory cell (i,j) accumulates charges therein. In contrast, if the read data Dout corresponds to the H level, the memory cell (i,j) does not accumulate the charges. Therefore, the memory cell (i,j) re-accumulates the charges equivalent to previous charges, which are previously accumulated before the read operation. Thus, it is possible to complete the refresh.

According to the embodiment 3 described above, data written in the memory cell are read out in response to a condition as to whether the level of the bit line "Bit" changes from the pull-up level to the prescribed level, which is determined by the aforementioned resistance ratio, or not. Therefore, it is unnecessary to pre-charge the bit line before the read operation. Thus, it is possible to alternately change the read cycle $T_R$ and the write cycle $T_W$ without break.

[D] Embodiment 4

Figure 7:
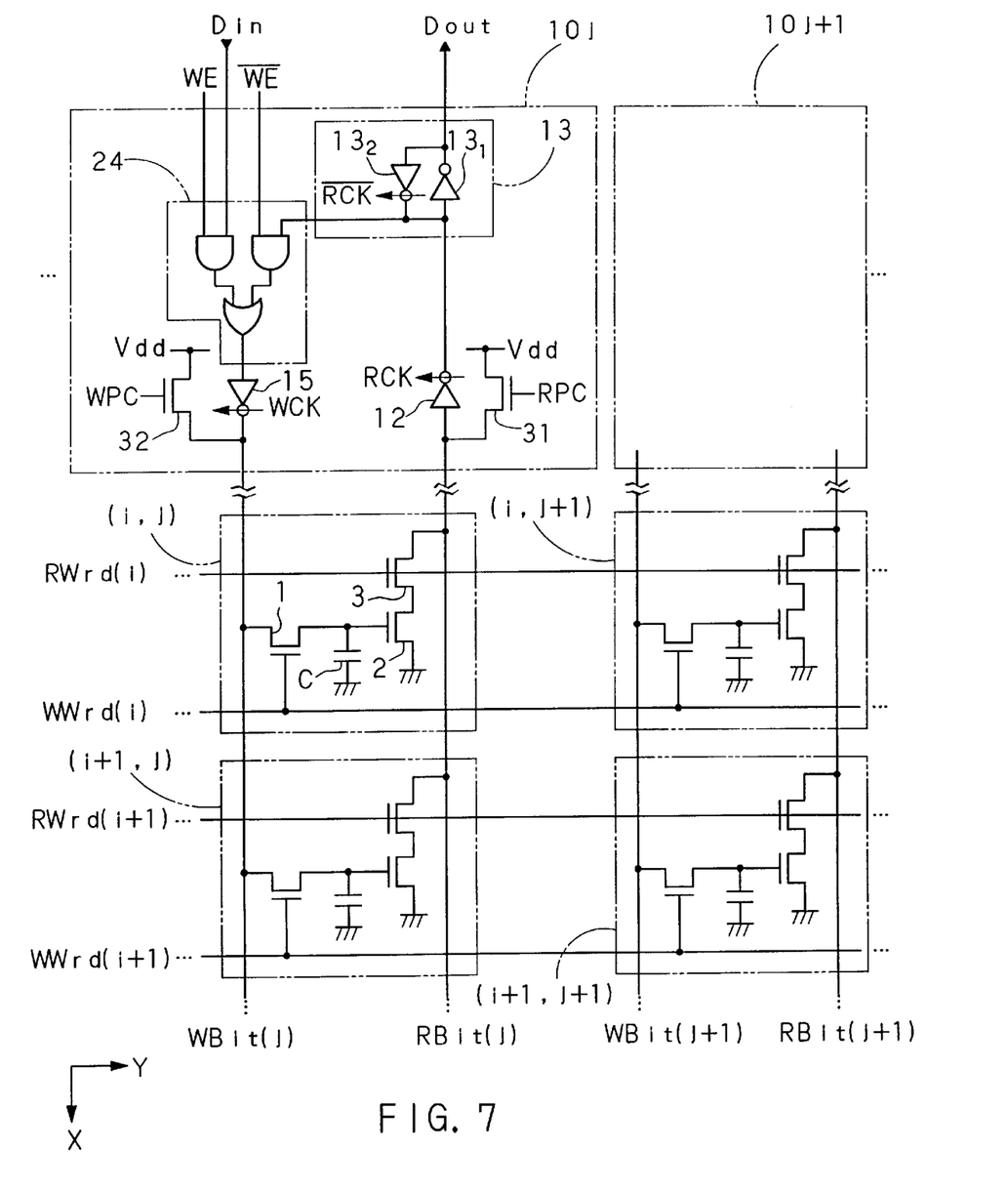
FIG. 7 is a circuit diagram showing circuit configurations of selected parts of a cell array, which is configured using sense amplifiers and memory cells in accordance with embodiment 4 of the invention.

With reference to FIG. 7, a description will be given with respect to a cell array, which is configured using senses amplifiers and memory cells in accordance with embodiment 4 of the invention. The embodiment 4 is a modification of the foregoing embodiment 2 (see FIG. 4). In FIG. 7, parts equivalent to those shown in FIG. 4 will be designated by the same reference symbols, hence, the description thereof will be omitted according to needs.

In the foregoing embodiment 2 (or embodiment 1), the sense amplifier refreshes the memory cell as follows:

Data, which are read from the read bit line "RBit" at the timing of the read clock pulse RCK, are inverted, so that inverted data are supplied to the write bit line "WBit" at the timing of the write clock pulse WCK.

However, there is a possibility that the aforementioned configuration of the embodiment 2 (or embodiment 1) may have a disadvantage, as follows:

Charges accumulated at the gate of the transistor 2 may leak to the write bit line WBit due to sub-threshold current of the transistor 1. So, the memory cell may have a short duration in storage of data.

To avoid such a disadvantage, the sense amplifier (e.g., $10_j$) is partially modified to adjust the clock signal WPC controlling the transistor 32 in such a manner that the write bit line WBit is pre-charged in all the times other than write duration.

The sense amplifier $10_j$ shown in FIG. 7 is basically identical to the foregoing one shown in 4, wherein a difference lies in adjustment of the clock signal WPC. That is, the aforementioned selector 14 is replaced by a selector 24 in FIG. 7. This selector 24 is basically similar to the foregoing selector 14 and is designed to select a write operation or a refresh operation.

Next, a description will be given with respect to operations of the sense amplifier employed in the cell array in accordance with the embodiment 4 with reference to FIGS. 8A to 8H.

Like the aforementioned sense amplifier shown in FIG. 4, the sense amplifier shown in FIG. 7 uses the read clock pulse RCK and the write clock pulse WCK. However, the clock signals VVPC and RPC are adjusted in such a way that in a very short period of time just after a trailing-edge timing of the read clock pulse RCK, WPC decreases to the L level while RPC increases to the H level.

Before a start time $T_{41}$ of the read cycle, the clock signal RPC (see FIG. 8D) remains at the H level, so that the transistor 31 is "on". Thus, the read bit line RBit(j) is pre-charged by the source voltage Vdd.

After the start time $T_{41}$ of the read cycle, the read word line RWrd(i) (see FIG. 8C) is selected and is increased in level to the H level, while the clock signal RPC (see FIG. 8D) is decreased to the L level. In this case, data "0" is stored at the gate of the memory cell (i,j), in other words, charges are accumulated in the memory cell (i,j). So, the transistors 2 and 3 are "on". As a result, the read bit line RBit(j) (see FIG. 8E) is changed in level from the pre-charged level to the ground level. On the other hand, the clock signal WPC (see FIG. 8G) is at the H level in the read cycle, so that the transistor 23 is "on". Thus, the write bit line WBit(j) (see FIG. 8H) is pre-charged.

Figures 8A, 8B:
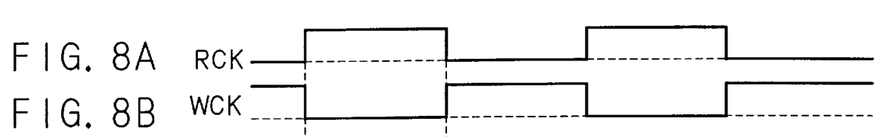
FIG. 8A shows read clock pulses RCK.
FIG. 8B shows write clock pulses WCK.
Figures 8C, 8D, 8E:
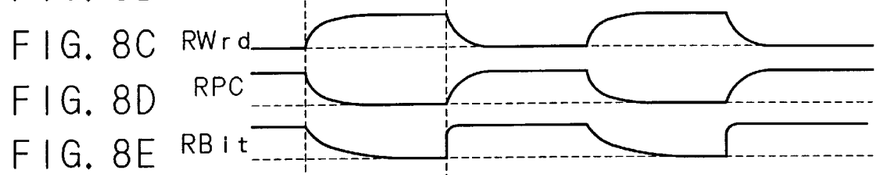
FIG. 8C shows variations in level of a read word line.
FIG. 8D shows a clock signal RPC.
FIG. 8E shows variations in level of a read bit line.
Figures 8F, 8G:
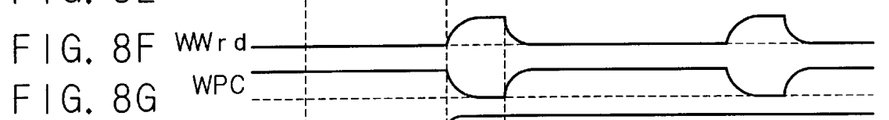
FIG. 8F shows variations in level of a write word line.
FIG. 8G shows a clock signal WPC.
Figure 8H:
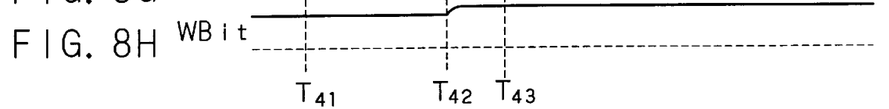
FIG. 8H shows variations in level of a write bit line.
Figures 9A, 9B:
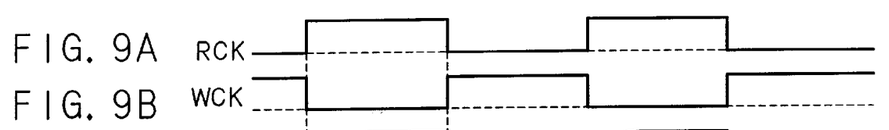
FIG. 9A shows the read clock pulses RCK.
FIG. 9B shows the write clock pulses WCK.
Figures 9C, 9D, 9E:
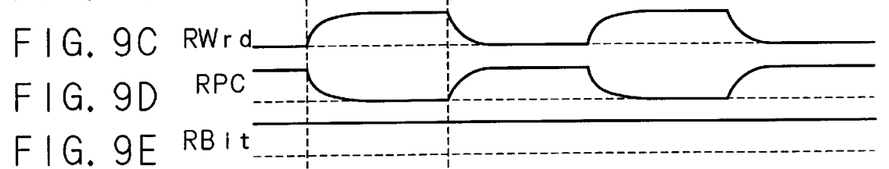
FIG. 9C shows variations in level of the read word line.
FIG. 9D shows the clock signal RPC.
FIG. 9E shows variations in level of the read bit line.
Figures 9F, 9G, 9H:
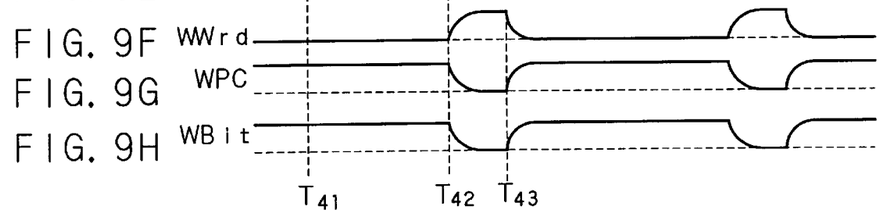
FIG. 9F shows variations in level of the write word line.
FIG. 9G shows the clock signal WPC.
FIG. 9H shows variations in level of the write bit line.

Thereafter, a time elapses so that the cell array comes to the timing corresponding to a start time $T_{42}$ of the write cycle (or an end time of the read cycle). At this time, the write clock pulse rises in level to the H level. In addition, the write word line WWrd(i) (see FIG. 8F) is selected and is set at the H level. Further, the clock signal WPC (see FIG. 8G) is decreased to the L level. Therefore, the "clocked" inverter 15 inverts the ground level corresponding to the read level. So, the write bit line WBit(j) remains at the H level corresponding to the pre-charged level. In this case, the transistor 1 is "on", so that charges are accumulated at the gate of the transistor 2 again. Incidentally, the write bit line WBit(i) is slightly increased in level from the pre-charged level as shown in FIG. 8H. Reasons are as follows:

Strictly speaking, the pre-charged level is lower than the source voltage Vdd by voltage reduction due to on-resistance of the transistor 32. Such voltage reduction apparently causes a lift-up in output level of the clocked inverter 15.

After a time $T_{43}$, the write word line WWrd(i) (see FIG. 8F) is decreased to the L level, while the clock signal WPC (see FIG. 8G) is increased to the H level. Thus, it is possible to complete the refresh with respect to the data "0".

Next, a description will be given with respect to operations of the sense amplifier (e.g., $10_j$) which refresh data "1" stored in the memory cell (i,j) with reference to FIGS. 9A to 9H.

Before the start time $T_{41}$ of the read cycle, the read bit line RBit is pre-charged. After the start time $T_{41}$ of the read cycle, the read word line RWrd(i) (see FIG. 9C) is selected and is increased in level to the H level. In addition, the clock signal RPC (see FIG. 9D) is decreased to the L level. In this case, the data "1" is stored at the gate of the memory cell (i,j), in other words, charges are not accumulated at the gate. So, the transistor 2 is "off". As a result, the read bit line Bit(j) (see FIG. 9E) remains at the pre-charged level.

Thereafter, a time elapses so that the cell array comes to the timing corresponding to the time $T_{43}$, the write word line WWrd(i) (see FIG. 9F) is decreased to the L level, while the clock signal WPC (see FIG. 9G) is increased to the H level. Thus, it is possible to complete the refresh with respect to the data "1".

Next, we will study about behaviors of the other memory cells which are disposed in the column j but which belong to other rows other than the row i under the situation that the refresh is performed on the data "0" or "1" with respect to the memory cell (i,j).

The write bit line WBit(j), which is shared by all the memory cells disposed in the column j, is at the L level only when the data "1" is written into the memory cell (i,j) which is selected. Specifically, the write bit line WBit(j) is at the L level in the duration between the times $T_{42}$ and $T_{43}$. In other periods other than such duration, the write bit line WBit(j) remains at the H level.

As for the other memory cells which are disposed in the column j but are not selected, the duration in which the write bit line WBit(j) is at the L level becomes short. This indicates that the charges accumulated at the gate of the memory cell are hardly leaked onto the write bit line WBit(j) due to the sub-threshold current of the transistor 1. Such is similarly said to the other memory cells disposed in the other columns.

In short, the embodiment 4 is designed such that the "write" duration between the times $T_{42}$ and $T_{43}$ is intentionally shortened. So, It is very difficult to leak the charges accumulated at the gate of the memory cell onto the write bit line.

The conventional technology suffers from a problem that the time to retain the data becomes short due to the leak of the charges at the gate of the transistor 2. The embodiment 4 is capable of effectively eliminating such a problem even if the system clock CK has a long cycle.

Incidentally, the aforementioned memory cells of the embodiments 3 and 4 are configured using the n-channel MOS transistors. However, this invention is not limited to such configurations. That is, it is possible to use p-channel MOS transistors instead of the n-channel MOS transistors.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A semiconductor memory cell comprising:

a memory cell;

a write word line for designating a write operation for the memory cell;

a write bit line for accumulating charges corresponding to a level thereof in the memory cell in accordance with the write operation;

a read word line for designating a read operation for the memory cell;

a read bit line whose level changes in response to the charges accumulated in the memory cell in accordance with the read operation; and a ground line having a ground level, wherein the write word line is connected with the write bit line by the memory cell while the read word line is connected with the read bit line by the memory cell, and wherein the write word line is arranged between the ground line and the read word line.

2. A cell array comprising:

a plurality of memory cells for accumulating charges, which are arranged in a matrix form constructed by rows and columns;

a plurality of write bit lines, each of which is commonly used by a first number of the memory cells which are arranged in a same column;

a plurality of read bit lines, each of which is commonly used by the first number of the memory cells which are arranged in the same column;

a plurality of write word lines, each of which is commonly used by a second number of the memory cells which are arranged in a same row; and a plurality of read word lines, each of which is commonly used by the second number of the memory cells which are arranged in the same row, wherein each of the plurality of write word lines is activated to perform write operations simultaneously on the second number of the memory cells which are arranged in the same row, while each of the plurality of read word lines is activated to perform read operations simultaneously on the second number of the memory cells which are arranged in the same row, and wherein each of the plurality of write word lines is arranged between a ground line having a ground level and each of the plurality of read word lines.

3. A semiconductor memory cell comprising:

a sense amplifier;

a memory cell for accumulating charges;

a read word line for designating a read operation on the memory cell;

a write word line for designating a write operation on the memory cell;

a read bit line whose level follows the charges accumulated in the memory cell, so that the sense amplifier senses the level of the read bit line to output read data in accordance with the read operation; and a write bit line whose level follows an output of the sense amplifier inputting write data so that the memory cell accumulates the charges therein in accordance with the write operation, wherein the write word line is arranged between a ground line having a ground level and the read word line.

4. A cell array comprising:

a plurality of memory cells for accumulating charges, which are arranged in a matrix form constructed by rows and columns;

a plurality of read word lines, each of which is connected with a first number of the memory cells which are arranged in a same row, wherein the first number corresponds to a number of the columns;

a plurality of write word lines, each of which is connected to the first number of the memory cells which are arranged in the same row;

a plurality of read bit lines, each of which is connected to a second number of the memory cells which are arranged in a same column, wherein the second number corresponds to a number of the rows;

a plurality of write bit lines, each of which is connected to the second number of the memory cells which are arranged in the same column; and a plurality of sense amplifiers, each of which is connected with the second number of the memory cells which are arranged in the same column and each of which is connected with each of the plurality of read bit lines and each of the plurality of write bit lines, wherein each of the plurality of read word lines is activated to perform read operations simultaneously on the first number of memory cells, which are respectively connected with the plurality of sense amplifiers to output read data, while each of the plurality of write word lines is activated to perform write operations simultaneously on the first number of memory cells, which are respectively connected with the plurality of sense amplifiers to input write data, and wherein each of the plurality of write word lines is arranged between a ground line having a ground level and each of the plurality of read word lines.

* * * * *